(12) United States Patent  (10) Patent No.: US 7,843,324 B2
Penney et al.  (45) Date of Patent: Nov. 30, 2010

(54) DETECTION ARRANGEMENTS

(75) Inventors: Stephen John Penney, Chelmsford (GB); Steven Ian Bennett, Portsmouth (GB)

(73) Assignee: Thorn Security Limited, Sunbury-on-Thames, Middlesex (GB)

( * ) Notice: Subject to any disclaimer, the term of this patent is extended or adjusted under 35 U.S.C. 154(b) by 308 days.

(21) Appl. No.: 11/884,507

(22) PCT Filed: Dec. 12, 2005

(86) PCT No.: PCT/GB2005/004793

§ 371 (c)(1), (2), (4) Date: Aug. 16, 2007

(87) PCT Pub. No.: WO2006/090100

PCT Pub. Date: Aug. 31, 2006

(65) Prior Publication Data

US 2008/0157962 A1   Jul. 3, 2008

(30) Foreign Application Priority Data

Feb. 22, 2005  (GB) ................. 0503638.9

(51) Int. Cl.
  *G08B 29/00*  (2006.01)
(52) U.S. Cl. ............... 340/511; 340/506; 340/507; 340/3.1; 340/825.36; 340/825.49
(58) Field of Classification Search ............ 340/506, 340/507, 511, 517, 521, 3.1, 825.36, 825.49
  See application file for complete search history.

(56) References Cited

U.S. PATENT DOCUMENTS 3,997,837 A   12/1976  Betz et al.
4,104,597 A   8/1978  Jacobus, Jr.

(Continued)

FOREIGN PATENT DOCUMENTS

EP     0 653 632 A1   5/1995

(Continued)

OTHER PUBLICATIONS

Office Action issued in EP App. No. 05818 45713-2215 on Feb. 1, 2010, 3 pages.

(Continued)

*Primary Examiner*—Daryl Pope
(74) *Attorney, Agent, or Firm*—Brinks Hofer Gilson & Lione

(57) ABSTRACT

A detection system in which a single sensor (14) is employed to detect two, or more, levels, or ranges, of a parameter. The output signal from the sensor (14) is fed to a detection circuit (12) for amplification and thence to a control circuit (24). The control circuit (24) is switchable, either manually, or preferably programmably, for example by a timer, between two or more modes of operation for processing the output signal from the sensor (14) in a different manner, for example using different algorithms, according to the condition that is to be detected. The switching of the control circuit (24) between its modes results in a signal being sent to the detection circuit (12) to change its sensitivity to the signal received from the sensor (14), thereby to maintain accuracy of measurement of the parameter in both or all modes of operation.

19 Claims, 2 Drawing Sheets

U.S. PATENT DOCUMENTS

| | | | |
|---|---|---|---|
| 4,505,600 A | | 3/1985 | Suzuki et al. |
| 4,636,774 A | | 1/1987 | Galvin et al. |
| 5,331,310 A | | 7/1994 | Stetter et al. |
| 5,369,397 A | | 11/1994 | Wong |
| 5,400,246 A | * | 3/1995 | Wilson et al. .................. 700/17 |
| 5,598,147 A | | 1/1997 | Mochizuki et al. |
| 2002/0135764 A1 | | 9/2002 | Oka et al. |
| 2003/0156031 A1 | | 8/2003 | Philippe |

FOREIGN PATENT DOCUMENTS

| | | |
|---|---|---|
| GB | 2 391 069 A | 1/2004 |
| JP | 62038669 | 2/1987 |
| WO | WO 95/06926 | 3/1995 |

OTHER PUBLICATIONS

Office Action issued in AU App. No. 2005328223 on Jul. 14, 2009, 3 pages.

Office Action issued in AU App. No. 2005328223 on Jan. 19, 2010 2 pages.

Response to Office Action issued in AU App. No. 2005328223 filed Oct. 27, 2009 10 pages.

* cited by examiner

DETECTION ARRANGEMENTS

RELATED APPLICATION

This application claims the benefit of the prior foreign application GB 0503638.9, filed Feb. 22, 2005. The entire teachings of the above application are incorporated herein by reference.

BACKGROUND OF THE INVENTION

The present invention relates to a detection arrangement, a detection system incorporating the arrangement, and its method of operation.

The existence of a fire, for example, may be detected by various means, and it is known to employ a plurality of sensing elements that are responsive to different parameters. One such sensing element may be a carbon monoxide gas detector. In some installations it is required also to detect toxic gases, of which carbon monoxide may be one. Conventionally, separate fire and gas detection circuits are installed each having, for example, a carbon monoxide sensing element, each element being associated with a detection circuit that, to provide the required measurement accuracy, is sensitive to, say, a range of 0 to 40 parts per million (PPM) in the fire detection circuit and a range of 35 to 500 PPM in the gas detection circuit.

In other applications, such as overpressure and explosion detection, for example, two detection circuits may be provided, each of which has a pressure sensor, with the circuits having different levels of sensitivity for detecting, on the one level, a comparatively low overpressure, and, on the other level, a much higher pressure indicative of an explosion.

It is an object of the present invention to provide a simplified detection circuit.

SUMMARY OF THE INVENTION

In accordance with the present invention, a detection arrangement is provided in which a single sensor is employed to detect two, or more, levels, or ranges, of a parameter. The output signal from the sensor is fed to a detection circuit, usually for amplification, and thence to a control circuit. The control circuit is switchable, either manually, or preferably programmably (for example by a timer), between two (or more) modes of operation for processing the output signal from the sensor in a different manner (for example using different algorithms) according to the condition that is to be detected.

The switching of the control circuit between its modes results in a signal being sent to the detection circuit to change its sensitivity to the signal received from the sensor, thereby to maintain accuracy of measurement of the parameter in both (or all) modes of operation.

In one embodiment of the present invention, there is provided an arrangement comprising a detecting circuit associated with a single sensor for detecting a parameter, and a control circuit that is arranged to provide different outputs in response to receiving an output signal from the sensor in dependence on the mode of operation of the control circuit, wherein the mode of operation of the control circuit is changed in accordance with predetermined conditions and upon a change of mode a switching signal is sent by the control circuit to the detecting circuit thereby correspondingly to adjust the sensitivity of the detecting circuit, and wherein processing of the output signal of the sensor by the control circuit is changed in accordance with its mode of operation.

In another embodiment of the present invention, there is provided a detection system comprising an arrangement according to said one embodiment of the invention, wherein the control circuit is located in a control box that is arranged to provide an indicating signal, dependent on the mode of operation of the control circuit, whenever the sensed parameter lies outside predetermined value or values.

In a further embodiment of the present invention, there is provided a method of operating a detection system in which a single sensor is arranged to monitor a parameter and to produce an output signal representative thereof, wherein a control circuit is operable on the sensor output signal in one or another of a plurality of modes in accordance with predetermined conditions, wherein a change of the mode of operation of the control circuit in accordance with the conditions causes a signal to be sent to a detecting circuit that receives the output signal from the sensor whereby the sensitivity of the monitoring of the parameter is adjusted in accordance with the change of mode, and wherein the control circuit produces an output signal representative of the output signal of the sensor in accordance with the mode of operation of the control circuit.

For example, a single carbon monoxide gas detector may be employed with a control circuit that is selectively programmed to determine whether the gas level is indicative of a fire or of a high toxic amount of the gas, and to generate an appropriate alarm signal.

In this example, the control circuit can be arranged to produce a digital output signal that is used to switch the gain characteristics of the carbon monoxide detecting circuit such that the output from the detecting circuit can be set at different sensitivities depending on whether the arrangement is set to operate in a fire sensing mode or a toxic gas detecting mode. The switching of the digital output may be controlled by software that also determines which algorithm is to be used to analyse the signals being returned from the sensor and which action needs to be taken. For example, in the case of detecting a fire, in one mode of operation, a signal may be generated to evacuate an area, whilst detecting a toxic gas leak, in another mode of operation, a signal may be generated to shut down a boiler.

Thus, in accordance with the present invention, the output from a single sensor may be used, selectively, to provide different warnings, or other information, using a single wiring circuit, rather than requiring separate sensors and separate wiring looms as has been required hitherto fore.

In an alternative arrangement, the entire software may be embedded in the detection circuit at the location of the sensor, with the control panel being remote therefrom.

An analogue addressable detection system is envisaged, such that each of a plurality of spaced-apart detectors (comprising a detection circuit and associated sensor) can be identified by an address, with a separate address being allocated for each of the functions (of the two of fire detection and toxic gas detection, for example) to be monitored by each detector.

It will be appreciated that only a single switching signal needs to be transmitted from the control circuit, located at a central region, to each of the detectors which may be connected in parallel at spaced-apart detecting regions. With typical long runs of cable, preferably EMC protected, an 8 bit communications channel is all that is required to serve a large number of detectors in the same loop, thus minimising the bandwidth requirement of the system.

The detection circuit may comprise an amplifier, and the switching of the sensitivity of the circuit may be effected by a FET, transistor, logic gate, etc., thereby to switch the gain of the circuit.

The switching signal may be effective to change the electrical resistance of a feedback loop of the amplifier.

BRIEF DESCRIPTION OF THE DRAWINGS

A detection system and a detection arrangement in accordance with the present invention will now be described, by way of example, with reference to the accompanying drawings, in which.

DESCRIPTION OF PREFERRED EMBODIMENT

Figure 1:
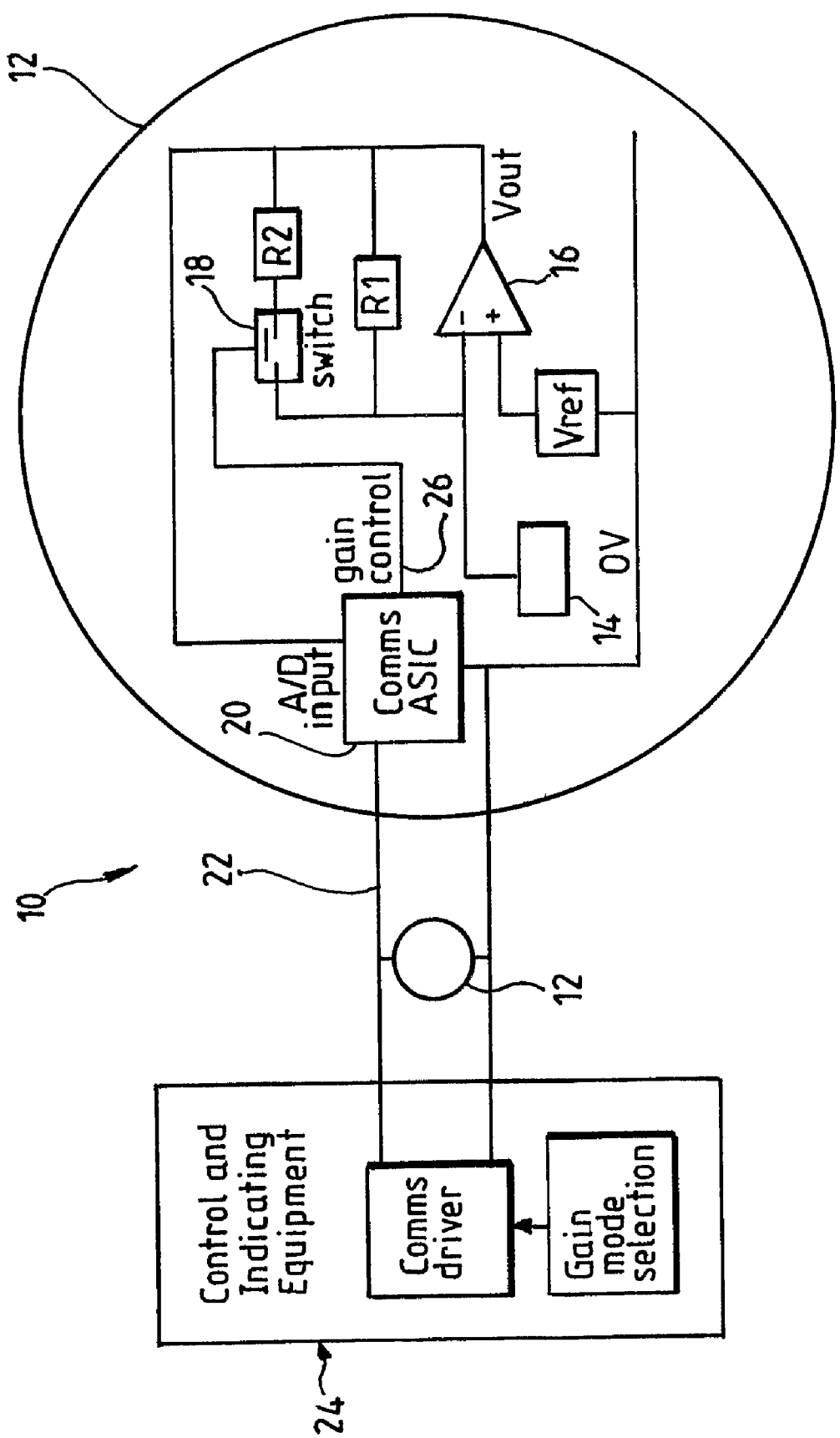
FIG. 1 is a schematic diagram of a detection system in accordance with an embodiment of the present invention.

With reference to FIG. 1, a detection system 10 is provided that can be used to perform two independent functions. For example, in a building management safety system, the system 10 can be used to monitor carbon monoxide (CO) which in a first configuration is used for fire detection or which in a second configuration is used to detect toxic levels of carbon monoxide.

The detection system 10 comprises a plurality of detectors 12 (only two of which are shown), which may be located in various zones around a building, factory, warehouse or the like. Each detector 12 includes a detection element 14 that can be used to detect carbon monoxide. Each detector 12 also includes an amplifier 16 and associated circuitry that enables the gain of the amplifier to be changed. The amplifier 16 is an operational amplifier arranged as a current to voltage amplifier having a resistor R1 permanently connected to form a feedback loop between the output and the inverting input of the operational amplifier. There is also provided a second resistor R2 which can be switched in and out of the feedback loop by a switch 18. Operation of the switch 18 changes the gain of the amplifier 16 from, for example, a first high gain mode when R1 is the only resistive component in the feedback loop to a low gain when R1 and R2 are connected in parallel in the feedback loop. This arrangement allows the sensitivity of the amplifier to be altered depending on the function required of the system 10 e.g. fire detection or detection of toxic gas levels.

The detection element 14 is coupled to the inverting input of the operational amplifier and the non inverting input of the op-amp is coupled to a reference voltage V-ref.

The detector 12 farther includes a communication application specific integrated circuit (ASIC) 20. The output of the amplifier 16, which is an analogue voltage representative of the carbon monoxide level detected by the detection element 14, is received by the comms ASIC 20 and converted from an analogue signal to a digital signal and then transmitted over a communication bus 22 connecting the detector 12 to a remote control panel 24. The remote control panel 24 may, for example, be located in a control room and be part of the building management safety system.

An output 26 of the ASIC 20 is coupled to the switch 18. One function of the ASIC 20 is to receive a command signal from the remote control panel 24 to set and latch the output 26 of the ASIC 20 so that the switch is maintained in either a conducting or non conducting state i.e. the switch is either closed or open.

The remote control panel 24 comprises circuitry for transmitting data over the communication bus 22 in accordance with software code in the control panel. The software code is used to select the function that the system 10 is to perform. This is achieved by the software code sending data to the ASIC to set the output 26 of the ASIC 20 and to select which one of a plurality of algorithms in the control panel 24 is to be used to process the data representative of the carbon monoxide sent to the control panel 24 from the detector.

Carbon monoxide levels for detecting fire are usually up to 40 PPM, whilst concentrations of carbon monoxide between 35 PPM and 500 PPM are usually considered to be toxic gas levels. Therefore, for fire detection it will be appreciated that the signal from the detector is required to have a high resolution over a limited range whilst for gas detection it is important to have a wide range and the resolution or the sensitivity is not so important. Due to the differences in both the sensitivity setting of the detector and the processing of the data therefrom, conventional systems having a carbon monoxide fire detection system and a separate carbon monoxide toxic gas detection system have used two discrete systems resulting in additional wiring and maintenance.

The system 10 described herein-above provides the advantage that the system can configure the physical hardware such that a single detection element 14 in a detector 12 can be used for measuring carbon monoxide for fire detection or toxic levels of carbon monoxide.

In use, when the detection system of the present invention is configured for detecting a fire by software in the remote control panel 24, the software sends a signal to the comms ASIC 20 of the detector 12 to set and latch the output 26 of the ASIC 20 so that the switch 18 is open and the amplifier 20 is in a high gain mode. At the same time, the software also selects which algorithm is to be used to analyse the digital signal representative of the carbon monoxide, and which alarm signal should be raised e.g., an alarm to evacuate the building in the event that a fire is detected.

If the detection system 10 is to be used a toxic gas detector, as configured by the software in the remote control panel 24, the software sends a signal to the comms ASIC 20 which sets and latches the output 26 of the ASIC 20 so that the switch 18 is closed and the amplifier is thus in a low gain mode. At the same time, the software selects the algorithm for analysing the signal representation of the carbon monoxide for toxic gas levels. In accordance with this algorithm, a different signal in the event of a toxic level of gas is generated, for example, a boiler shut down signal.

It will be appreciated that the detection system 10 may operate in a number of ways, for example, a detector 12 in the system may be set permanently to detect toxic gas levels, or permanently for fire detection. However, it is preferred for a detector in the system to be switchable from one function to another. For example, one or more of the detectors in the system may be arranged so that during the day the or each detector is arranged for fire detection and during the night the or each detector is arranged to detect toxic gas levels. The functionality of the or each detector is determined by the software in the remote control panel 24, which sets the configuration of the hardware and determines which algorithm is to be used for analysing the carbon monoxide data signal, and which alarm signal is to be generated.

Whilst in some instances, accurate sensing of a parameter for one function, e.g. fire detection may require only a short time, say seconds or a few minutes, accurate sensing of the parameter for another function, e.g. toxic gas level, may require a much larger time, perhaps several hours. It will thus be appreciated that the programming of the control system in the control panel 24 will be such that the detector 12 is switched, and its output signal processed, in each case for sufficient time to ascertain accurately the condition, e.g. level of gas present, that is being sensed.

In one embodiment the detection system is an analogue addressable system, such that each detector can be identified by an address. The remote control panel 24 allocates two addresses to each of the detectors, each address being associated with a respective function of the detector.

Figure 2:
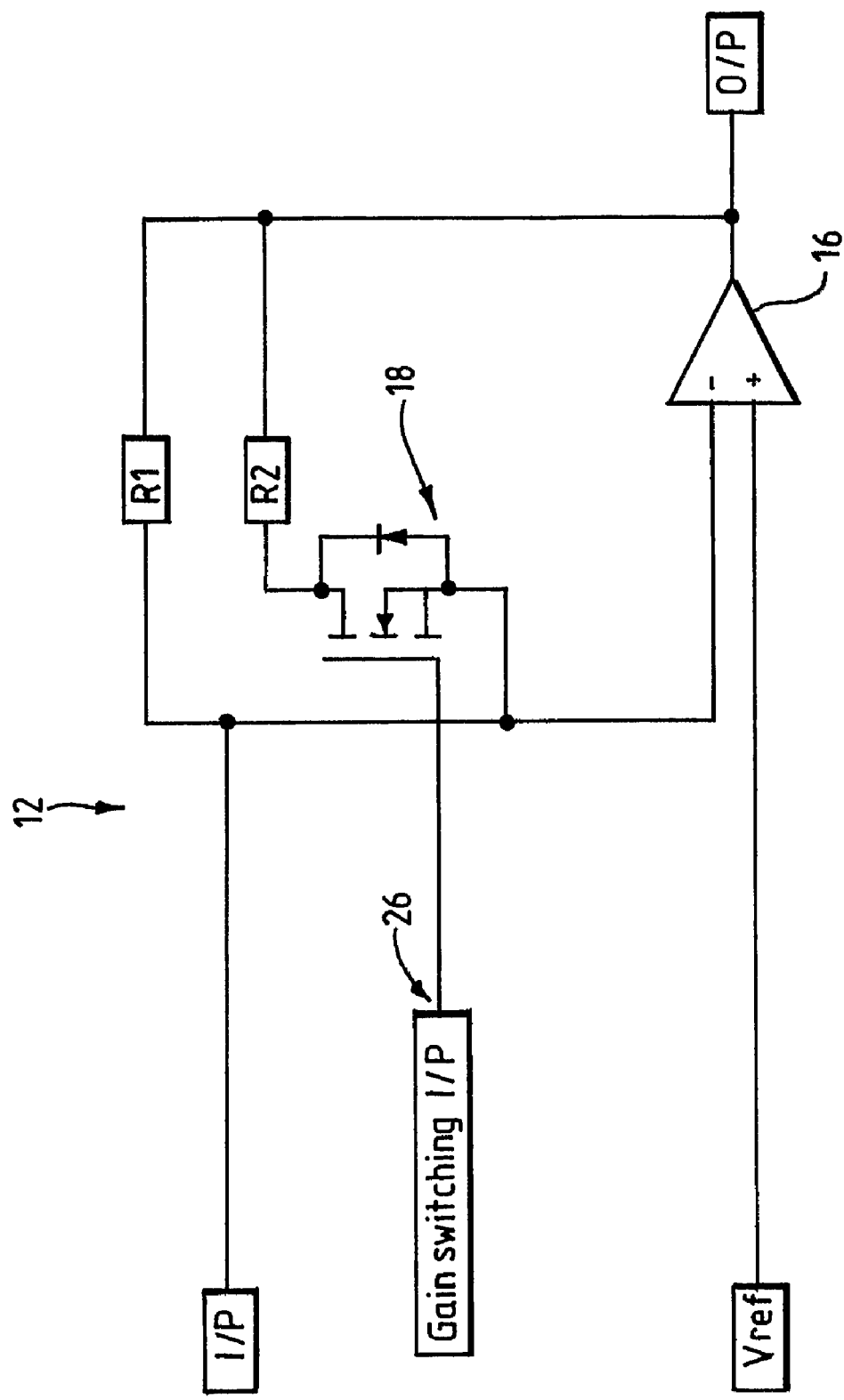
FIG. 2 shows part of an alternative schematic diagram of a detection system.

Referring also to FIG. 2, the switch 18 used to change the gain of the amplifier 20 can be an N channel FET with the gate of the FET connected to the output 26 of the comms ASIC 20. In this embodiment, the detection element 12 will sink a current, hence the input will source current. However, the configuration can be altered to cater for a current source input or an input with both current sink and current source characteristics, by appropriate selection of the gain switch.

In another embodiment of the present invention, the detection system 10 may be used in a first function for monitoring ambient temperature in order to control the temperature in a room of a building, for example, or in a second function for detecting a fire in a building. In this embodiment, the detection element can be a thermal element and the system can be used for temperature control during the day or fire detection during the night. Alternatively, in the first mode the system may be used to generate an alarm if there is a drop in the temperature which could indicate a boiler failure.

In yet a further embodiment, the system may be a security camera system which in a first mode is such that the camera can be manually operated by a user to survey an area in general, the resulting pictures being analysed in accordance with a first algorithm, and in a second mode the camera may be stationary and another algorithm is used in which software that incorporates pattern recognition looks for, for example, unexpected changes in the image.

Various modifications may be made to the invention without departing from the scope thereof. For example, the switch 18 may be implemented by means other than a FET. The switch may be a transistor, a logic gate or the like.

In one embodiment, the algorithm for performing each function may be embedded within a processor in the detector. In this embodiment the remote control panel may simply send a command signal to the detector to switch from a first function or mode to a second function. When the command signal is received, the algorithm and the gain of the amplifier will be correspondingly changed at the same time in the detector. The output signal from the detector can have different output levels, for example plus 5 volts or minus 5 volts, depending on whether a toxic gas or fire alarm is to be indicated. This embodiment of detector enables a less sophisticated conventional fire panel to be used.

The invention claimed is:

1. A method for operating a detection device that detects at least one parameter, the method comprising:
    receiving a control signal indicative of at least one of a first mode and a second mode, the detection device in the first mode detecting at least one parameter based on a first sensitivity and in the second mode detecting the at least one parameter based on a second sensitivity, the first sensitivity being different from the second sensitivity;
    adjusting a sensitivity of the detection device to one of the first sensitivity or the second sensitivity based on the received control signal; and
    generating an output based on the adjusted sensitivity.

2. The method of claim 1 wherein the first mode detects a first alarm, and the second mode detects a second alarm.

3. The method of claim 2 wherein the first alarm comprises a fire alarm, and the second alarm comprises a toxic gas alarm.

4. The method of claim 1 wherein adjusting the sensitivity of the detection device to one of the first sensitivity or the second sensitivity based on the received control signal comprises configuring at least a part of the detection device.

5. The method of claim 4 wherein the detection device comprises hardware; and
    wherein configuring at least a part of the detection device comprises configuring at least a part of the hardware of the detection device.

6. The method of claim 5 wherein the detection device comprises an amplifier and circuitry in a feedback loop of the amplifier; and
    wherein configuring at least a part of the hardware of the detection device comprises reconfiguring at least a part of the feedback loop of the amplifier.

7. The method of claim 1 wherein the detection device comprises a sensor and an adjustable sensitivity component, the adjustable sensitivity component receiving an output of the sensor; and
    wherein adjusting the sensitivity of the detection device comprises adjusting at least a part of the adjustable sensitivity component.

8. The method of claim 1 further comprising analyzing the output with a first type of analysis when the detection device is in the first mode, and analyzing the output with a second type of analysis when the detection device is in the second mode.

9. The method of claim 8 wherein the first type of analysis comprises determining whether the output is in a first range, and the second type of analysis comprises determining whether the output is in a second range, the first range being different from the second range.

10. The method of claim 1 wherein one of the first mode or second mode is selected automatically.

11. A detection device comprising:
    a receiver for receiving a control signal indicative of at least one of a first mode and a second mode, the detection device in the first mode detecting at least one parameter based on a first sensitivity and in the second mode detecting the at least one parameter based on a second sensitivity, the first sensitivity being different from the second sensitivity;
    a sensor for measuring the at least one parameter;
    an adjustable sensitivity component configured to:
        receive the control signal and the at least one parameter;
        operate in one of the first mode or the second mode;
        adjust a sensitivity of the adjustable sensitivity device to one of the first sensitivity or the second sensitivity based on the received control signal; and
        generate an output based on the adjusted sensitivity.

12. The detection device of claim 11 further comprising an analytical component configured to:
    analyze the output with a first type of analysis when the detection device is in the first mode; and
    analyze the output with a second type of analysis when the detection device is in the second mode.

13. The detection device of claim 12 wherein the analytical component is remote from the sensor and the adjustable sensitivity component.

14. The detection device of claim 13 wherein the receiver receives the control signal from a control panel.

15. The detection device of claim 14 wherein the control panel comprises the analytical component; and wherein the analytical component selects the first type of analysis or the second type of analysis based on the manual input.

16. The detection device of claim 11 wherein the detection device consists of a single sensor; and
wherein the single sensor generates data in order to determine whether a gas level is indicative of a fire and to determine whether there is a toxic level of gas.

17. A detection system comprising:
a detection device comprising:
 a receiver for receiving a control signal indicative of at least one of a first mode and a second mode, the detection device in the first mode detecting at least one parameter based on a first sensitivity and in the second mode detecting the at least one parameter based on a second sensitivity, the first sensitivity being different from the second sensitivity;
 a sensor for measuring the at least one parameter;
 an adjustable sensitivity component configured to:
  receive the control signal and the at least one parameter;
  operate in one of the first mode and the second mode;
  adjust a sensitivity of the adjustable sensitivity component to one of the first sensitivity or the second sensitivity based on the received control signal;
  generate an output based on the adjusted sensitivity; and
  send the output to a control panel, and
the control panel remote from the detection device and configured to:
 determine a mode under which the detection system is operating, the mode comprising one of the first mode and second mode;
 select a type of analysis based on the mode, a first type of analysis being selected when the mode is in the first mode and a second type of analysis being selected when the mode is in the second mode;
 send the control signal to the detection device based on the mode;
 receive the output from the detection device;
 analyze the output using the selected type of analysis; and
 generate an alarm event based on the analysis of the output.

18. The detection system of claim 17 wherein the mode is selected automatically.

19. The detection system of claim 17 wherein the first mode detects a fire alarm, and the second mode detects a toxic gas alarm.

* * * * *